United States Patent
Ko

(10) Patent No.: US 9,432,010 B2
(45) Date of Patent: Aug. 30, 2016

(54) BUFFER CONTROL CIRCUIT AND MULTI-CHIP PACKAGE INCLUDING THE SAME

(71) Applicant: SK hynix Inc., Gyeonggi-do (KR)

(72) Inventor: Jae-Bum Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/566,342

(22) Filed: Dec. 10, 2014

(65) Prior Publication Data

US 2016/0036425 A1 Feb. 4, 2016

(30) Foreign Application Priority Data

Jul. 31, 2014 (KR) .................. 10-2014-0098111

(51) Int. Cl.
*H03K 5/13* (2014.01)
*H03K 5/135* (2006.01)
*H03K 5/1534* (2006.01)
*H01L 25/18* (2006.01)
*H01L 25/065* (2006.01)
*H03K 5/00* (2006.01)

(52) U.S. Cl.
CPC ............ *H03K 5/135* (2013.01); *H03K 5/1534* (2013.01); *H01L 25/0657* (2013.01); *H01L 25/18* (2013.01); *H01L 2225/06541* (2013.01); *H03K 2005/00286* (2013.01)

(58) Field of Classification Search
CPC .............. H03K 5/135; H03K 5/1534; H03K 2005/00286; H01L 25/0657; H01L 25/18; H01L 2225/06541
USPC ................ 327/156, 157, 158, 235, 263, 276
See application file for complete search history.

(56) References Cited

U.S. PATENT DOCUMENTS

| 2010/0020583 A1* | 1/2010 | Kang ................. G11C 5/02 365/51 |
| 2011/0291730 A1* | 12/2011 | Ahn ................... H03K 5/135 327/276 |

FOREIGN PATENT DOCUMENTS

KR 1020120076793 7/2012

* cited by examiner

*Primary Examiner* — John Poos
(74) *Attorney, Agent, or Firm* — IP & T Group LLP

(57) ABSTRACT

A buffer control circuit includes: an activation control block suitable for generating a buffer activation control signal by detecting a first input of a repeatedly provided chip select signal; and a buffer suitable for buffering the chip select signal in response to the buffer activation control signal after the generation of the buffer activation control signal.

11 Claims, 7 Drawing Sheets

BUFFER CONTROL CIRCUIT AND MULTI-CHIP PACKAGE INCLUDING THE SAME

CROSS-REFERENCE TO RELATED APPLICATIONS

The present application claims priority of Korean Patent Application No. 10-2014-0098111, filed on Jul. 31, 2014, which is incorporated herein by reference in its entirety.

BACKGROUND

1. Field

Exemplary embodiments of the present invention relate to a semiconductor design technology, and more particularly, to a buffer control circuit capable of controlling an activation operation of a buffer and a multi-chip package including the buffer control circuit.

2. Description of the Related Art

Multi-chip package technology, where plurality of semiconductor chips are included in a single package, is classified into Single Die Packages (SDP), Double Die Packages (DDP) and Quad Die Packages (QDP) based on the number of memory chips included in the package.

A fuse cutting scheme is used to determine whether the package will operate as an SDP, DDP or QDP. The fuse cutting scheme also determines whether a buffer coupled with each memory chip is activated. The buffer is included in each memory chip and transmits an enabling signal of a circuit operation block for operating the memory chip. Therefore the activation of the buffer during fuse cutting is what determines whether its corresponding memory chip will be enabled.

Once the multi-chip package is set to SDP, DDP or QDP, it is difficult to change. For example, in a QDP, four buffers corresponding to four memory chips are activated. The QDP semiconductor memory device activates the four buffers based on QDP information, which select which fuses to cut, and a buffer activation signal for activating the buffers transferred from an external device. To go from QDP to DDP or SDP, buffers would need to be disabled. However, cutting fuses is permanent and difficult to reverse. Therefore, it is difficult to change from one type of multi-chip package technology to another after the initial fuse cutting has been completed.

SUMMARY

Exemplary embodiments of the present invention are directed to a buffer control circuit capable of controlling a buffer based on an input signal.

Further exemplary embodiments of the present invention are directed to a multi-chip package capable of controlling an activation of a plurality of memory chips based on input of a chip select signal without fuse cutting.

In accordance with an embodiment of the present invention, a buffer control circuit may include: an activation control block suitable for generating a buffer activation control signal by detecting a first input of a repeatedly provided chip select signal; and a buffer suitable for buffering the chip select signal in response to the buffer activation control signal after the generation of the buffer activation control signal.

The activation control block may generate the buffer activation control signal enabled a predetermined time after the first input of the chip select signal.

The activation control block may include: a shift unit suitable for generating a plurality of control signals in response to a clock signal by sequentially shifting the chip select signal; a latch unit suitable for latching the chip select signal and the control signals in response to a last one among the control signals; a clock control unit suitable for generating a plurality of clock signals having different enabling time sections in response to an output signal of the latching unit; an input control signal generation unit suitable for generating a plurality of input control signals by sequentially shifting the chip select signal in response to the plurality of clock signals; and an activation control signal generation unit suitable for generating the buffer activation control signal by detecting rising and falling edges of each of the input control signals.

The activation control signal generation unit may include a toggle generation part suitable for generating a toggle signal by adding up detection signals of the rising and falling edges.

The buffer activation control signal may be enabled in response to the toggle signal.

In accordance with another embodiment of the present invention, a multi-chip package may include: a master chip; a plurality of slave chips stacked in an upper portion of the master chip; and a through-silicon via suitable for transmitting a signal between to the master chip and the slave chips. The master chip may include a plurality of command input blocks suitable for detecting normal input of a plurality of chip select signals, and transferring the plurality of chip select signals to the plurality of slave chips.

The plurality of chip select signals may be repeatedly inputted.

Each of the command input blocks may include: an activation control block suitable for generating a buffer activation control signal by detecting a first input of a repeatedly provided chip select signal; and a buffer suitable for buffering the chip select signal in response to the buffer activation control signal after the generation of the buffer activation control signal.

The activation control block may generate the buffer activation control signal, which is enabled a predetermined time after the first input of the chip select signal.

The activation control block may include: a shift unit suitable for generating a plurality of control signals in response to a clock signal by sequentially shifting the chip select signal; a latch unit suitable for latching the chip select signal and the control signals in response to a last one among the control signals; a clock control unit suitable for generating a plurality of clock signals having different enabling time sections in response to an output signal of the latching unit; an input control signal generation unit suitable for generating a plurality of input control signals by sequentially shifting the chip select signal in response to the plurality of clock signals; and an activation control signal generation unit suitable for generating the buffer activation control signal by detecting rising and falling edges of each of the input control signals.

The activation control signal generation unit may include a toggle generation part suitable for generating a toggle signal by adding up detection signals of the rising and falling edges.

The buffer activation control signal may be enabled in response to the toggle signal.

Each of the master chip and the plurality of slave chips may include an ID generation block suitable for generating an ID thereof.

In accordance with another embodiment of the present invention, a semiconductor system may include: a first device suitable for successively providing activation information two or more times; and a second device suitable for generating an activation control signal in response to the activation information, and performing an operation in response to the activation control signal.

The second device may include: an activation control block suitable for generating the activation control signal in response to a first input of the activation information; and a circuit operation block suitable for performing an operation in response to the control signal after the generation of the activation control signal.

The first device may be a memory controller.

The second device may be a semiconductor memory.

The activation information may be a command or an address for controlling the second device.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

Figure 1:
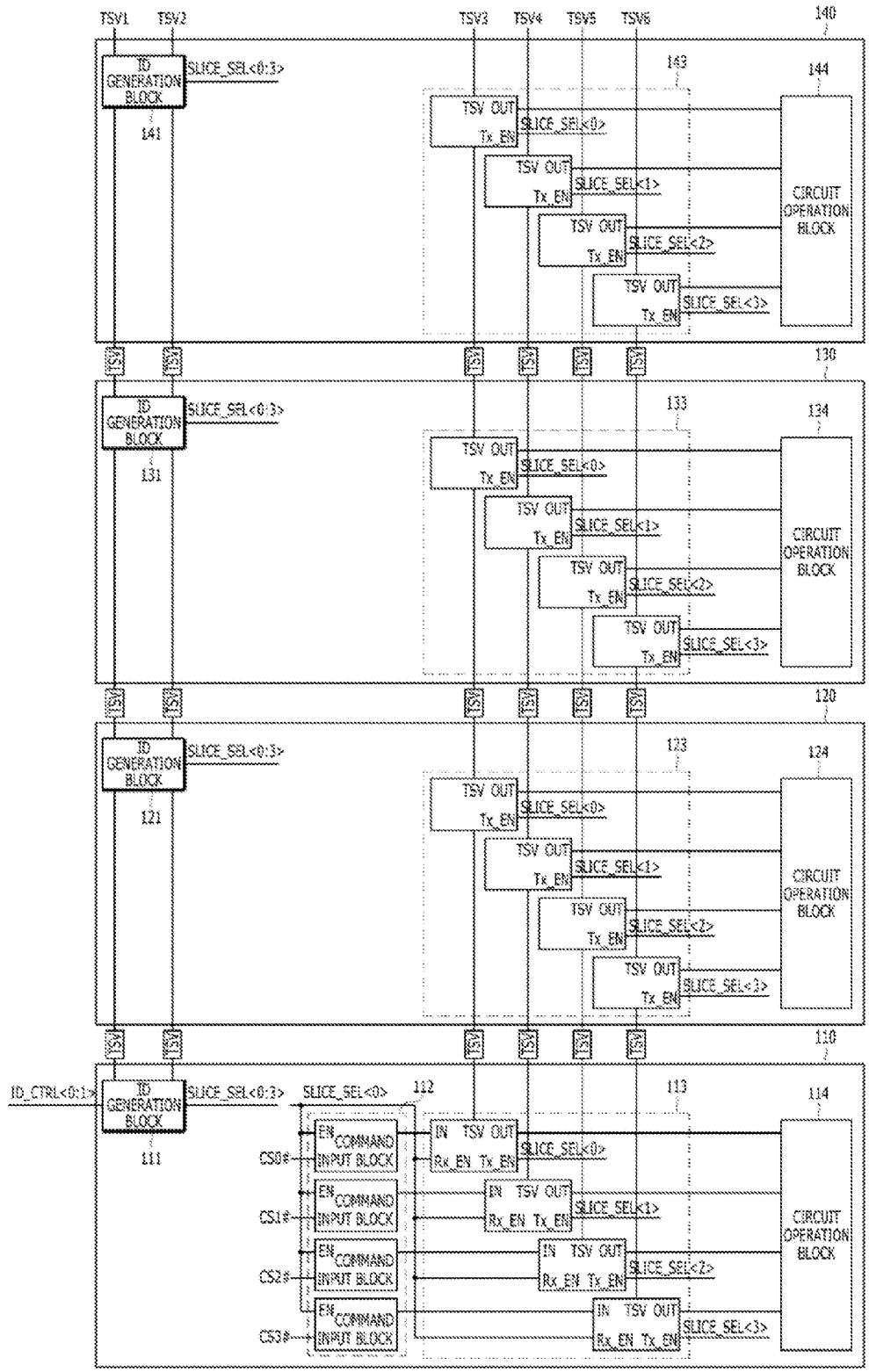
FIG. 1 is a block diagram illustrating a multi-chip package in accordance with an embodiment of the present invention.

FIG. 1 is a block diagram illustrating a multi-chip package in accordance with an embodiment of the present invention.

Referring to FIG. 1, the multi-chip package includes first to fourth memory chips 110 to 140. The first to fourth memory chips 110 to 140 may be coupled with each other through first to sixth through-silicon vias TSV1 to TSV6.

The first and second through-silicon vias TSV1 and TSV2 among the first to sixth through-silicon vias TSV1 to TSV6 may transmit ID control signals ID_CTRL<0:1> for generating chip IDs SLICE_SEL<0:3> which are provided to each of the memory chips 110 to 140. The third to sixth through-silicon vias TSV3 to TSV6 may transmit chip select signals CS0# to CS3# corresponding to the first to fourth memory chips 110 to 140, respectively.

For a clear description, the first memory chip 110 is representatively described below. The first memory chip 110 may include an ID generation block 111, a plurality of command input blocks 12, a plurality of TSV blocks 113 and a circuit operation block 114.

The ID generation block 111 may generate chip IDs SLICE_SEL<0:3> based on ID control signals ID_CTRL<0:1> provided to the first memory chip 110 from an external device (not illustrated). The chip IDs SLICE_SEL<0:3> may represent each of the first to fourth memory chips 110 to 140. The ID generation block 111 may include a 1-bit adder and a decoder.

The ID generation block 111 may receive the 2-bit ID control signals ID_CTRL<0:1> from the external device, and generate the 4-bit chip IDs SLICE_SEL<0:3>.

For example, the ID generation block 111 of the first memory chip 110 may increase the value of the ID control signals ID_CTRL<0:1> by 1, and transmit the ID control signals ID_CTRL<0:1> having the increased value to a neighboring memory chip, e.g., the ID generation block 121 of the second memory chip 120, through the first and second through-silicon vias TSV1 and TSV2.

For example, the ID generation block 111 of the first memory chip 110 may generate the chip IDs SLICE_SEL<0:3> corresponding to the first memory chip 110, e.g., the chip IDs SLICE_SEL<0:3> having the value of '1000', based on the ID control signals ID_CTRL<0:1>. Subsequently, the ID generation block 111 may increase the value '00' of the ID control signals ID_CTRL<0:1> by 1 and transmit the ID control signals ID_CTRL<0:1> having the increased value '01' to the ID generation block 121 of the second memory chip 120 through the first and second through-silicon vias TSV1 and TSV2. Therefore, the ID generation blocks 121 to 141 of the second to fourth memory chips 120 to 140 may generate the chip IDs SLICE_SEL<0:3> having the value of '0100', the chip IDs SLICE_SEL<0:3> having the value of '0010' and the chip IDs SLICE_SEL<0:3> having the value of '0001', respectively.

The plurality of command input blocks 112 may be included only in the first memory chip 110. The plurality of command input blocks 112 may correspond to a number of bits of the chip IDs SLICE_SEL<0:3> outputted from the ID generation block 111.

The plurality of command input blocks 112 may be turned on according to a turn-on signal for the first memory chip 110, for example, the chip IDs SLICE_SEL<0:3> representing the first memory chip 110, e.g., the chip IDs SLICE_SEL<0:3> having the value of '1000'.

The plurality of command input blocks 112 may transfer the chip select signals CS0# to CS3# from the external device to the plurality of TSV blocks 113. For example, one among the plurality of command input blocks 112 corresponding to the first memory chip 110 may be activated in response to the enabled chip select signal CS0# among the chip select signals CS0# to CS3# corresponding to the first memory chip 110. The activated one of the plurality of command input blocks 112 may transfer the subsequently inputted chip select signal CS0# to a corresponding one among the plurality of TSV blocks 113.

Each of the plurality of command input blocks 112 may be a buffer control circuit for activating internal buffers, which gill be described below with reference to FIG. 2.

The plurality of TSV blocks 113 may correspond to the number of bits of the chip IDs SLICE_SEL<0:3> outputted from the ID generation block 111. The plurality of TSV blocks 113 may transfer the chip select signals CS0# to CS3# from the command input blocks 112 to the circuit operation blocks 114 to 144 included in the first to fourth memory chips 110 to 140, respectively.

The plurality of TSV blocks 113 included in the first memory chip 110 may be turned on by the turn-on signal for the first memory chip 110, for example, the first chip ID SLICE_SEL<0> among the chip IDs SLICE_SEL<0:3>.

The plurality of TSV blocks 113 may respectively transfer the chip select signals CS0# to CS3# from the plurality of command input blocks 112 to the plurality of TSV blocks 123 to 143 included in the second to fourth memory chips 120 to 140. Each of the plurality of TSV blocks 123 to 143 included in the second to fourth memory chips 120 to 140 may receive the chip select signals CS0# to CS3# through the third to sixth through-silicon vias TSV3 to TSV6. In other words, the plurality of TSV blocks 113 included in the first memory chips 110 may transfer the chip select signals CS0# to CS3# from the plurality of command input blocks 112 to the neighboring memory chip through the third to sixth through-silicon vias TSV3 to TSV6. The plurality of TSV blocks 123 to 143 of the second to fourth memory chips 120 to 140 may receive the chip select signals CS0# to CS3# through the third to sixth through-silicon vias TSV3 to TSV6.

Further, the plurality of TSV blocks 113 to 143 each included in the memory chips 110 to 140 may output the chip select signals CS0# to CS3# in response to the chip IDs SLICE_SEL<0:3>, respectively. For example, among the plurality of TSV blocks 113 included in the first memory device 110, a single TSV block corresponding to the first memory device 110 may output the corresponding chip select signal, or the first chip select signal CS0# to the circuit operation block 114 included in the first memory device 110 in response to the chip IDs SLICE_SEL<0:3> representing the first memory device 110 or in response to the first chip ID SLICE_SEL<0>. For example, among the plurality of TSV blocks 123 included in the second memory device 120, a single TSV block corresponding to the second memory device 120 may output the corresponding chip select signal, or the second chip select signal CS#1 to the circuit operation block 124 included in the second memory device 120 in response to the chip IDs SLICE_SEL<0:3> representing the second memory device 110 or in response to the second chip ID SLICE_SEL<1>.

A plurality of circuit operation blocks 114 to 144 may correspond to the plurality of chip select signals CS0# to CS3#, respectively. Each one of the plurality of circuit operation blocks 114 to 144 may operate in response to a corresponding one among the plurality of chip select signals CS0# to C53# transmitted from the corresponding one among the plurality of TSV blocks 113 to 143. For example, the circuit operation block 114 corresponding to the chip select signal CS0# corresponding to the first memory chip 110 is activated and controls an operation of the first memory chip 110.

To sum up, when one among the chip select signals CS0# to CS3# is enabled, the command input blocks 112 included in the first memory chip 110 are activated. The enabled chip select signal may be shared with the plurality of TSV blocks 113 to 143 of the first to fourth memory chips 110 to 140 in order to selectively activate one of the plurality of circuit operation blocks 114 to 144. Thus, one among the first to fourth memory chips 110 to 140 may selectively operate according to the activated one of the plurality of circuit operation blocks 114 to 144.

In accordance with the embodiment of the present invention, the multi-chip package may generate the chip IDs SLICE_SEL<0:3> respectively corresponding to the memory chips 110 to 140 based on the ID control signals ID_CTRL<0:1> inputted from an external device. Also, the multi-chip package may activate the memory chips 110 to 140 based on the chip IDs SLICE_SEL<0:3> and an enabled one among the chip select signals CS0# to CS3# inputted from an external device.

In accordance with the embodiment of the present invention, the multi-chip package may be set to be one among the SDP, DDP and QDP types according to combination of the chip select signals CS0# to CS3#. For example, when the first chip select signal CS0# is enabled, the multi-chip package may operate as the SDP type. When the first and second chip select signals CS0# and CS1# are enabled, the multi-chip package operates as the DDP type. When the first to fourth chip select signals CS0# to CS3# are enabled, the multi-chip package operates as the QDP type.

According to prior art, once one among the SDP, the DDP and the QDP is set, it is not possible to change the type of multi-chip package. However, in accordance with the embodiment of the present invention, it is possible to change the type of multi-chip package among SDP, DDP and QDP, whenever needed, based on the selective enabling of the chip select signals CS0# to CS3#.

Although the chip select signals CS0# to CS3# serve as selection signals for the memory chips, commands such as RAS# CAS# and WE# other than the chip select signals CS0# to CS3# also may serve as the selection signals for the memory chips.

Figure 2:
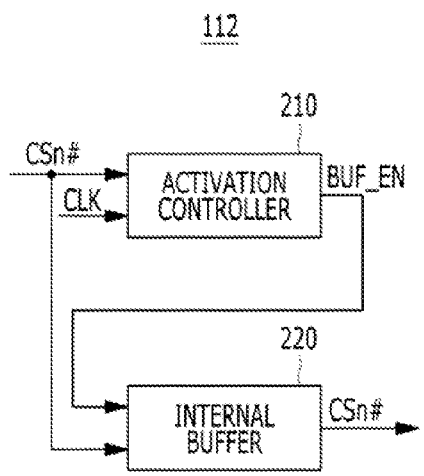
FIG. 2 is a block diagram illustrating a command input block shown in FIG. 1.

FIG. 2 is a block diagram illustrating one of the plurality of command input blocks 112 shown in FIG. 1.

Referring to FIG. 2, each of the plurality of command input blocks 112 may include an activation controller 210 and an internal buffer 220.

The activation controller 210 may generate a buffer activation control signal BUF_EN for activation of the internal buffer 220 in response to a corresponding one CSn# among the chip select signals CS0# to CS3#. The buffer activation control signal BUF_EN may be generated in response to a plurality of control signals enabled during a predetermined time after the chip select signal CSn# is inputted. The predetermined time may be required to determine whether the chip select signal CSn# is normally inputted, which is to be described below with reference to FIG. 3.

The internal buffer 220 may buffer and output the chip select signal CSn# in response to the buffer activation control signal BUF_EN generated by the activation controller 210. The chip select signal CSn# outputted from the internal buffer 220 may correspond to one among the chip select signals CS0# to CS3# outputted from the plurality of command input blocks 112, i.e.

The chip select signal CSn# may be repeatedly inputted. The initial chip select signal CSn# may be inputted to the activation controller 210 and the subsequent chip select signal CSn# may be inputted to the internal buffer 220 after the internal buffer 220 is activated in response to the buffer activation control signal BUF_EN.

Figure 3:
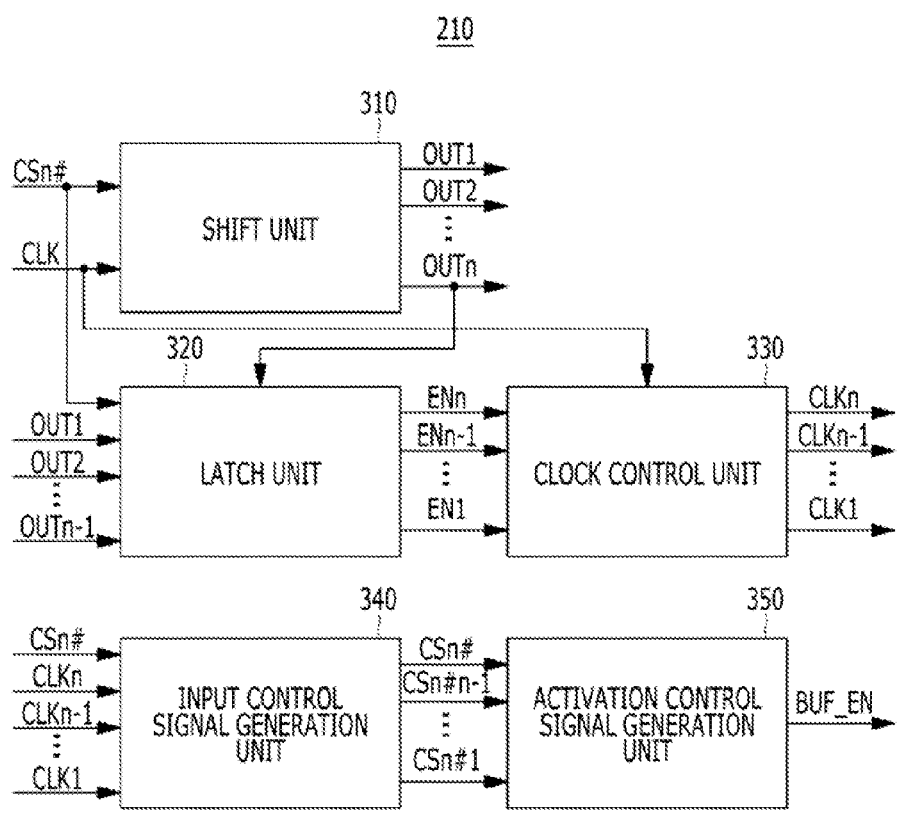
FIG. 3 is a block diagram illustrating an activation controller shown in FIG. 2.

FIG. 3 is a block diagram illustrating the activation controller 210 shown in FIG. 2.

Referring to FIG. 3, the activation controller 210 may include a shift unit 310, a latch unit 320, a clock control unit 330, an input control signal generation unit 340, and an activation control signal generation unit 350.

The shift unit 310 may sequentially shift the chip select signal CSn# in response to a clock signal CLK and generate a plurality of control signals OUT1 to OUTn. The plurality of control signals OUT1 to OUTn may be used for determining whether the chip select signal CSn# is inputted. The plurality of control signals OUT1 to OUTn may be enabled during the predetermined time after the chip select signal CSn# is inputted.

The latch unit 320 may generate a plurality of flag signals ENn to EN1 for controlling the clock signal CLK in response to the chip select signal CSn# and the control signals OUT1 to OUTn. The latch unit 320 may generate the flag signals ENn to EN1 corresponding to the chip select signal CSn# and the control signals OUT1 to OUTn−1 except for the last control signal OUTn, respectively, in response to the last control signal OUTn among the control signals OUT1 to OUTn. A detailed description on the latch unit 320 is made below with reference to FIG. 5.

The clock control unit 330 may control the clock signal CLK in response to the flag signals ENn to EN1 outputted from the latch unit 320, and generate a plurality of clock signals CLKn to CLK1. Since the clock signals CLKn to CLK1 are generated according to the flag signals ENn to EN1, enable timing of the plurality of clock signals CLKn to CLK1 may be different from each other.

The input control signal generation unit 340 may sequentially shift the chip select signal CSn# in response to the clock signals CLKn to CLK1 and generate a plurality of input control signals CSn#n to CSn#1. The input control signal generation unit 340 may synchronize the chip select signal CSn# with the clock signals CLKn to CLK1, and shift the chip selection signal CSn# in order to generate the input control signals CSn#n to CSn#1. Therefore, since the chip select signal CSn# is shifted based on the synchronized clock signals CLKn to CLK1, shift numbers of the chip select signal CSn# based on the synchronized clock signals CLKn to CLK1 may be different from each other.

The activation control signal generation unit 350 may generate the buffer activation control signal BUF_EN for activation of the internal buffer 220 based on the edge signals obtained by detecting rising and falling edges of each of the input control signals CSn#n to CSn#1 outputted from the input control signal generation unit 340. Also, the activation control signal generation unit 350 may generate a toggle signal by adding up the edge signals in order to generate the buffer activation control signal BUF_EN. When the toggle signal toggles, even once, the activation control signal generation unit 350 may enable the buffer activation control signal BUF_EN, thereby activating the internal buffer 220. Detailed description on the activation control signal generation unit 350 is made below with reference to FIG. 6.

Hereafter, detailed operations of the activation controller 210 are described below with reference to FIG. 7.

Figure 4:
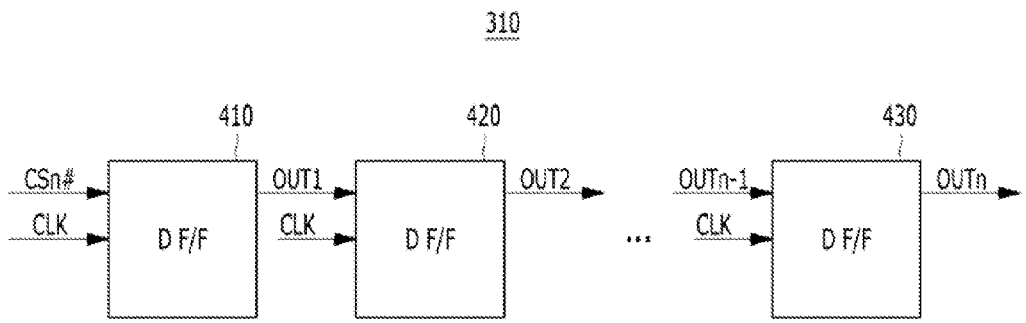
FIG. 4 is a block diagram illustrating a shift unit shown in FIG. 3.

FIG. 4 is a block diagram illustrating the shift unit 310 shown in FIG. 3.

Referring to FIG. 4, the shift unit 310 may include a plurality of serially coupled D flip flops 410 to 430. A foremost one of the plurality of D flip flops 410 to 430 may receive the chip select signal CSn# and output a first one of the control signals OUT1 to OUTn in synchronization with the clock signal CLK. Also, the following one of the plurality of D flip flops 410 to 430 may receive the clock CLK and the output of the former one of the plurality of D flip flops 410 to 430, and output the following one of the control signals OUT1 to OUTn in synchronization with the clock signal CLK. Thus, the shift unit 310 may sequentially shift the chip select signal CSn# and output the control signals OUT1 to OUTn.

The control signals OUT1 to OUTn may determine whether the chip select signal CSn# is normally inputted. In other words, when the chip select signal CSn# is not a normal signal but noise, the control signals OUT1 to OUTn may not be normally shifted and outputted. Therefore, when the shift unit 310 receives the chip select signal CSn# and outputs the control signals OUT1 to OUTn based on the chip select signal CSn# during the predetermined time, the chip select signal CSn# may be determined as a normally inputted signal.

Figure 5:
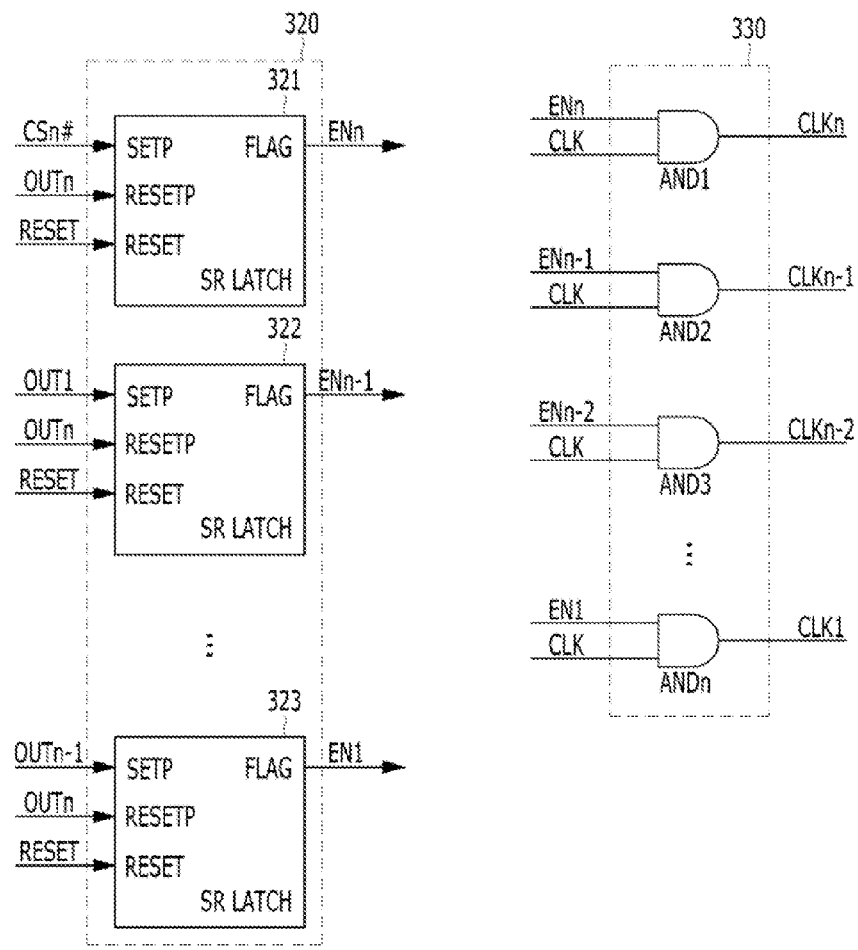
FIG. 5 is a block diagram illustrating a latch unit and a clock control unit shown in FIG. 3.

FIG. 5 is a block diagram illustrating the latch unit 320 and the clock control unit 330 shown in FIG. 3.

Referring to FIG. 5, the latch unit 320 may include a plurality of SR latch circuits 321 to 323. The SR latch circuits 321 to 323 may receive the chip select signal CSn# and the control signals OUT1 to OUTn−1 except for the last control signal OUTn among the control signals OUT1 to OUTn as set signals SETP, respectively, and may receive the last control signal OUTn as a reset signal RESETP. The SR latch circuits 321 to 323 may generate the flag signals ENn to EN1. Since the input signals of the SR latch circuits 321 to 322 require different amounts of time to be enabled different enablement time), the output signals of the SR latch circuits 321 to 322 or the flag signals ENn to EN1 may be enabled at different times.

The clock control unit 330 may generate a plurality of clock signals CLKn to CLK1 in response to the clock CLK and the flag signals ENn to EN1. The clock control unit 330 may include AND gates AND1 to ANDn.

Figure 6:
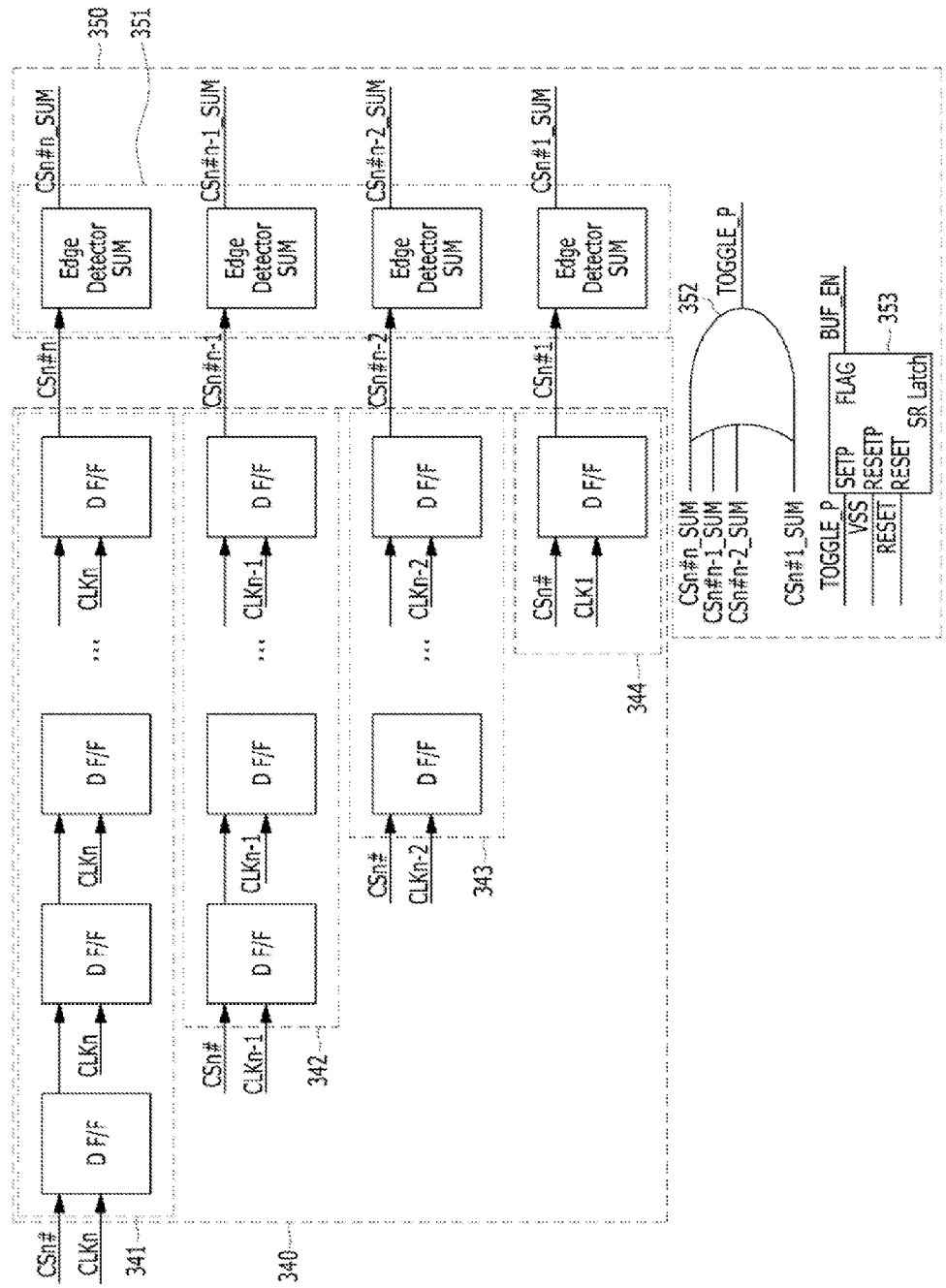
FIG. 6 is a block diagram illustrating an input control signal generation unit and an activation control signal generation unit shown in FIG. 3.

FIG. 6 is a block diagram illustrating the input control signal generation unit 340 and the activation control signal generation unit 350 shown in FIG. 3.

Referring to FIG. 6, the input control signal generation unit 340 may include a plurality of input control signal generation parts 341 to 344. Each of the input control signal generation parts 341 to 344 is formed of a plurality of D flip-flop circuits. The input control signal generation parts 341 to 344 may generate the input control signals CSn#n to CSn#1 by synchronizing the chip select signal CSn# with the corresponding clock signals CLKn to CLK1, respectively. The D flip-flop circuits included in the input control signal generation parts 341 to 344 may correspond to the duration of the flag signals ENn to EN1, respectively.

The activation control signal generation unit 356 may include an edge detection part 351, a toggle generation part 352 and an SR latch circuit 353.

The edge detection part 351 may detect the rising and failing edges of each of the input control signals CSn#n to CSn#1 outputted from the input control signal generation unit 340. Also, the edge detection part 351 may generate a plurality of edge detection signals CSn#n_SUM to CSn#1_SUM by adding up the rising and falling edges of each of the input control signals CSn#n to CSn#1.

The toggle generation part 352 may include an OR gate. The toggle generation part 352 may generate a toggle signal TOGGLE_P by adding up the edge detection signals CSn#n_SUM to CSn#1_SUM outputted from the edge detection part 351.

The SR latch circuit 353 may generate the buffer activation control signal BUF_EN for activating the internal buffer 220 when the toggle signal TOGGLE_P toggles even once. Thus, the internal buffer 220 may be activated in response to the buffer activation control signal BUF_EN, and may buffer and output the chip select signal CSn#.

Figure 7:
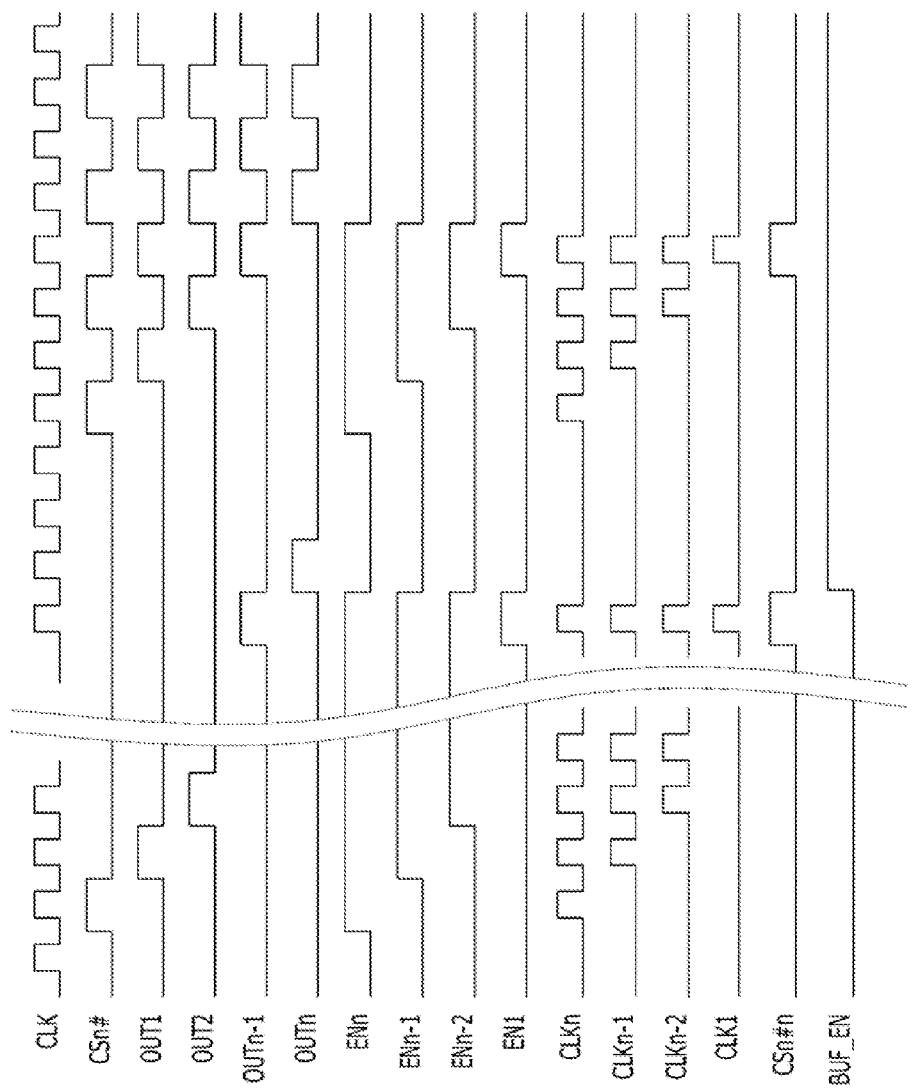
FIG. 7 is a timing diagram illustrating an operation of a command input block shown in FIG. 3.

FIG. 7 is a timing diagram illustrating an operation of the activation controller 210 shown in FIG. 3.

Referring to FIGS. 2 to 7, the operation of the activation controller 210 is described below.

The shift unit 310 may sequentially shift the chip select signal CSn# and generate the control signals OUT1 to OUTn which are sequentially enabled. Subsequently, the latch unit 320 may SR-latch the chip select signal CSn# and the control signals OUT1 to OUTn−1, and may generate the flag signals ENn to EN1. The enabling sections of the flag signals ENn to EN1 may be different from each other according to the control signals OUT1 to OUTn.

Subsequently, the clock signals CLKn to CLK1 may be generated based on the clock signal CLK in response to the flag signals ENn to EN1. Since the clock signals CLKn to CLK1 are generated in response to the flag signals ENn to EN1, the enabling sections of the clock signals CLKn to CLK1 may be different from each other, which is similar to the flag signals ENn to EN1.

Subsequently, the input control signal generation unit 340 may generate the input control signals CSn#n to CSn#1. The $n^{th}$ input control signal CSn#n among the input control signals CSn#n to CSn#1 may be generated based on the $n^{th}$ clock signal CLKn. The edge detection part 351 may generate the toggle signal TOGGLE_P (not shown) by detecting and adding up the rising and falling edges of the $n^{th}$ input control signal CSn#n. Thus, the buffer activation control signal BUF_EN may be enabled when the toggle signal TOGGLE_P toggles even once. In other words, the buffer activation control signal BUF_EN is enabled on the falling edge of the $n^{th}$ input control signal CSn#n so that the internal buffer 220 may be controlled to be activated.

To sum up, when the chip select signal CSn# is determined as a normal signal, the internal buffer 220 may be controlled to be automatically activated and perform the buffering operation of the chip select signal CSn#.

On the other hand, since the activation of the internal buffer 220 may be automatically set based on whether the chip select signal CSn# is inputted differently from the prior scheme where the operation of the internal buffer 220 is set through the fuse cutting, the size of the occupied area and current consumption may decrease as the necessity of the fuse decreases.

Also as the internal buffer 220 is activated, the command input blocks 112, and thus each of the memory chips 110 to 140, may be activated.

Figure 8:
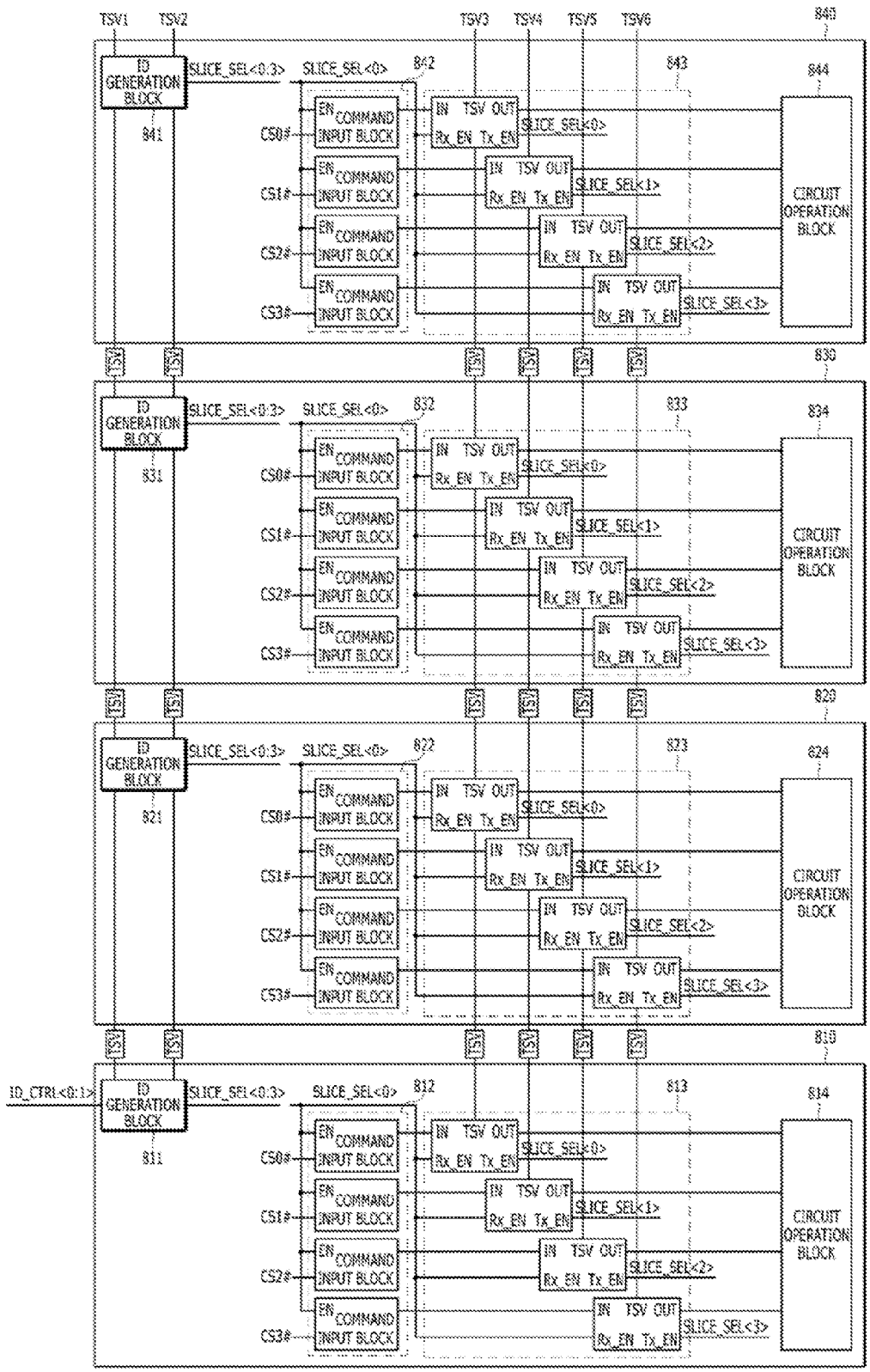
FIG. 8 is a block diagram illustrating a multi-chip package in accordance with another embodiment of the present invention.

FIG. 8 is a block diagram illustrating a multi-chip package in accordance with another embodiment of the present invention.

Referring to FIG. 8, the multi-chip package may include first to fourth memory chips 810 to 840. The first memory chip 810 may be the same as the first memory chip 110 described with reference to FIGS. 1 to 7.

Different from the second to fourth memory chips 120 to 140 described with reference to FIGS. 1 to 7, the second to fourth memory chips 820 to 840 may further include a plurality of command input blocks 822 to 842 for receiving chip select signals CS0# to CS3#, respectively.

The plurality of command input blocks 812 to 842 may be included in the first to fourth memory chips 810 to 840, respectively, and may receive the chip select signals CS0# to CS3#. However, since the first to fourth memory chips 810 to 840 may operate according to the chip select signals CS0# to CS3# transmitted from the first memory chip 810 through a plurality of through-silicon vias TSV3 to TSV6, the command input blocks 822 to 842 included in the second to fourth memory chips 820 to 840 may be deactivated. In other words, the first to fourth memory chips 810 to 840 may the same as one another. However, only one of the plurality of command input blocks 812 to 842 may be activated. For example, the command input blocks 812 included in the first memory chip 810 may be activated and control the operations of the first to fourth memory chips 810 to 840 while the rest of the plurality of command input blocks 812 to 814 included in the second to fourth memory chips 820 to 840 are deactivated.

Figure 9:
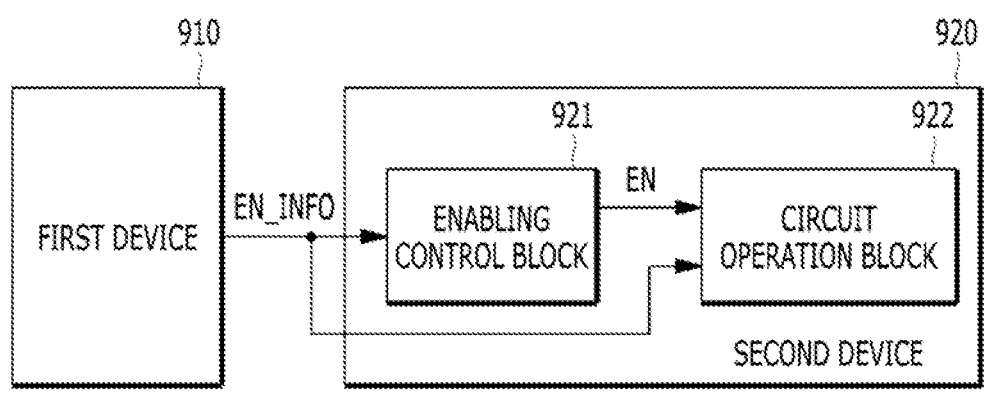
FIG. 9 is a block diagram illustrating a semiconductor system in accordance with an embodiment of the present invention.

FIG. 9 is a block diagram illustrating a semiconductor system in accordance with an embodiment of the present invention.

Referring to FIG. 9, the semiconductor system may include a first device 910 and a second device 920.

The first device 910 may successively supply activation information EN_INFO to the second device 920 two or more times for control of the second device 920.

The second device 920 may include an activation control block 921 and a circuit operation block 922.

The activation control block 921 may generate an activation control signal EN by detecting first input of the activation information EN_INFO among the successive input of the activation information EN_INFO. The activation information EN_INFO may be a command or an address for an operation of the second device 910. The activation control block 921 may be one among the command input blocks 112 described with reference to FIGS. 1 to 7.

The circuit operation block 922 may perform an operation corresponding to the following input of activation information EN_INFO after generation of the activation control signal EN, which is based on the first input of the activation information EN_INFO. In other words, the activation information EN_INFO may be inputted to the circuit operation block 922 after the activation control signal EN is enabled. The circuit operation block 922 may be one among the circuit operation blocks 114 to 144 described with reference to FIGS. 1 to 7.

To sum up, the first device 910 may output the activation information EN_INFO successively two or more times for controlling the operation of the second device 920, and the second device 920 may generate the activation control signal EN in response to the first input of the activation information EN_INFO and perform the command or address operation based on the second input of the activation information EN_INFO in response to the activation control signal EN after the generation of the activation control signal EN.

In accordance with the embodiments of the present invention, the semiconductor memory may reduce current consumption by controlling an enabling of a buffer based on whether an input signal is inputted.

Also, as enabling of a plurality of memory chips is controlled based on a chip select signal, a multi-chip package may be easily configured as an SDP, a DDP and a QDP, and may easily be changed even after an initial selection.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A buffer control circuit, comprising:
   an activation control block suitable for generating a buffer activation control signal by detecting a first input of a repeatedly provided chip select signal; and
   a buffer suitable for buffering the chip select signal in response to the buffer activation control signal after the generation of the buffer activation control signal, wherein the activation control block generates the buffer activation control signal, which is enabled a predetermined time after the first input of the chip select signal, wherein the activation control block includes:
  a shift unit suitable for generating a plurality of control signals in response to a clock signal by sequentially shifting the chip select signal;
  a latch unit suitable for latching the chip select signal and the control signals in response to a last one among the control signals;
  a clock control unit suitable for generating a plurality of clock signals having different enabling time sections in response to an output signal of the latching unit;
  an input control signal generation unit suitable for generating a plurality of input control signals by sequentially shifting the chip select signal in response to the plurality of clock signals; and
  an activation control signal generation unit suitable for generating the buffer activation control signal by detecting rising and falling edges of each of the input control signals.

2. The buffer control circuit of claim 1, wherein the activation control signal generation unit includes a toggle generation part suitable for generating a toggle signal by adding up detection signals of the rising and falling edges.

3. The buffer control circuit of claim 2, wherein the buffer activation control signal is enabled in response to the toggle signal.

4. A multi-chip package, comprising:
  a master chip;
  a plurality of slave chips stacked in an upper portion of the master chip; and
  a through-silicon via suitable for transmitting a signal between the master chip and the slave chips,
  wherein the master chip includes a plurality of command input blocks suitable for detecting normal input of a plurality of chip select signals, and transferring the plurality of chip select signals to the plurality of slave chips,
  wherein the plurality of chip select signals are repeatedly inputted,
  wherein each of the command input blocks includes:
    an activation control block suitable for generating a buffer activation control signal by detecting a first input of a repeatedly provided chip select signal; and
    a buffer suitable for buffering the chip select signal in response to the buffer activation control signal after the generation of the buffer activation control signal,
  wherein the activation control block generates the buffer activation control signal, which is enabled a predetermined time after the first input of the chip select signal,
  wherein the activation control block includes:
    a shift unit suitable for generating a plurality of control signals in response to a clock signal by sequentially shifting the chip select signal;
    a latch unit suitable for latching the chip select signal and the control signals in response to a last one among the control signals;
    a clock control unit suitable for generating a plurality of clock signals having different enabling time sections in response to an output signal of the latching unit;
    an input control signal generation unit suitable for generating a plurality of input control signals by sequentially shifting the chip select signal in response to the plurality of clock signals; and
    an activation control signal generation unit suitable for generating the buffer activation control signal by detecting rising and falling edges of each of the input control signals.

5. The multi-chip package of claim 4, wherein the activation control signal generation unit includes a toggle generation part suitable for generating a toggle signal by adding up detection signals of the rising and falling edges.

6. The multi-chip package of claim 5, wherein the buffer activation control signal is enabled in response to the toggle signal.

7. The multi-chip package of claim 4, wherein each of the master chip and the plurality of slave chips include an ID generation block suitable for generating an ID thereof.

8. A semiconductor system, comprising:
  a first device suitable for successively providing activation information two or more times; and
  a second device suitable for generating an activation control signal in response to the activation information, and performing an operation in response to the activation control signal,
  wherein the second device is a semiconductor memory.

9. The semiconductor system of claim 8, wherein the second device includes:
  an activation control block suitable for generating the activation control signal in response to a first input of the activation information; and
  a circuit operation block suitable for performing an operation in response to the control signal after the generation of the activation control signal.

10. The semiconductor system of claim 8, wherein the first device is a memory controller.

11. The semiconductor system of claim 8, wherein the activation information is a command or an address for controlling the second device.

* * * * *